United States Patent
Sugita et al.

(10) Patent No.: US 7,565,049 B2
(45) Date of Patent: Jul. 21, 2009

(54) LASER LIGHT SOURCE, AND TWO-DIMENSIONAL IMAGE FORMING DEVICE

(75) Inventors: Tomoya Sugita, Osaka (JP); Kiminori Mizuuchi, Osaka (JP); Ken'ichi Kasazumi, Osaka (JP); Akihiro Morikawa, Osaka (JP); Kazuhisa Yamamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 10/582,334

(22) PCT Filed: Dec. 9, 2004

(86) PCT No.: PCT/JP2004/018360

§ 371 (c)(1),
(2), (4) Date: Jun. 9, 2006

(87) PCT Pub. No.: WO2005/057743

PCT Pub. Date: Jun. 23, 2005

(65) Prior Publication Data

US 2007/0147456 A1 Jun. 28, 2007

(30) Foreign Application Priority Data

Dec. 10, 2003 (JP) .............................. 2003-411441

(51) Int. Cl.
*G02B 6/00* (2006.01)

(52) U.S. Cl. ................ 385/133; 372/50.12; 372/50.121; 348/E9.026

(58) Field of Classification Search ................ 372/50.1, 372/50.12, 50.121; 362/257, 259, 511, 551, 362/553, 610; 385/133; 348/E9.026

See application file for complete search history.

(56) References Cited

U.S. PATENT DOCUMENTS

| | | | | |
|---|---|---|---|---|
| 4,330,761 A * | 5/1982 | Cohn et al. | ..................... | 372/4 |
| 5,225,171 A * | 7/1993 | Gaier | ......................... | 422/209 |
| 5,887,096 A * | 3/1999 | Du et al. | ....................... | 385/39 |
| 6,151,342 A * | 11/2000 | Nightingale et al. | ........... | 372/36 |
| 6,229,831 B1 * | 5/2001 | Nightingale et al. | ........... | 372/36 |
| 6,318,863 B1 * | 11/2001 | Tiao et al. | ...................... | 353/31 |
| 6,513,937 B1 * | 2/2003 | Dehmlow | .................... | 353/94 |
| 6,547,400 B1 * | 4/2003 | Yokoyama | ................... | 353/98 |

(Continued)

FOREIGN PATENT DOCUMENTS

CN    1333468 C    1/2002

(Continued)

OTHER PUBLICATIONS

Omoda et al., JP 2003-299088, Aug. 22, 2003.*

*Primary Examiner*—Sung H Pak
*Assistant Examiner*—Daniel Petkovsek
(74) *Attorney, Agent, or Firm*—Steptoe & Johnson LLP

(57) ABSTRACT

A laser light source (10) has semiconductor lasers (1) and a waveguide tube (3) for propagating emission light from each of the semiconductor lasers (1). The semiconductor lasers are arranged on the upper end on the incident surface (31) side of the waveguide tube such that the emission light (4) from each of the semiconductor lasers enters into the waveguide tube from one end surface (31) of the waveguide tube and exits from the other end surface (32) of the waveguide tube. The structure can realize a small-sized laser light source having high output and capable of outputting emission light having uniform emission light intensity distribution.

16 Claims, 10 Drawing Sheets

U.S. PATENT DOCUMENTS

| | | | |
|---|---|---|---|
| 6,554,463 B2 * | 4/2003 | Hooker et al. | 362/555 |
| 6,741,394 B1 | 5/2004 | Tanitsu et al. | 359/619 |
| 6,865,309 B2 * | 3/2005 | Dho | 385/15 |
| 6,916,097 B2 * | 7/2005 | Omoda et al. | 353/31 |
| 6,939,009 B2 * | 9/2005 | Fischer et al. | 353/43 |
| 6,966,685 B2 * | 11/2005 | Li et al. | 362/616 |
| 7,131,735 B2 * | 11/2006 | Yokoyama | 353/98 |
| 7,209,624 B2 * | 4/2007 | Reynolds et al. | 385/133 |
| 2003/0031029 A1 | 2/2003 | Kawaai et al. | 362/551 |

FOREIGN PATENT DOCUMENTS

| | | |
|---|---|---|
| CN | 1120551 C | 9/2003 |
| JP | 07-306304 | 11/1995 |
| JP | 07-307273 | 11/1995 |
| JP | 2000-180962 | 6/2000 |
| JP | 2001-356404 | 12/2001 |
| WO | WO 02/05038 A2 | 1/2002 |

* cited by examiner

LASER LIGHT SOURCE, AND TWO-DIMENSIONAL IMAGE FORMING DEVICE

CLAIM OF PRIORITY

This application claims priority under 35 USC 371 to International Application No. PCT/JP2004/018360, filed on Dec. 9, 2004, which claims priority to Japanese Patent Application No. 2003-411441, filed on Dec. 10, 2003, each of which is incorporated by reference in its entirety.

TECHNICAL FIELD

The present invention relates to a laser light source and a two-dimensional image forming device, and more particularly, to a high-output laser light source having a uniform emission light intensity distribution, and a two-dimensional image forming device using the laser light source.

BACKGROUND ART

Conventionally, laser light sources have mainly been applied to those utilizing focusing property of laser light and height of coherent light, such as measurement, optical communication, and optical disc. However, research and development of laser light sources are remarkable, and small-size high-output laser light sources represented by semiconductor lasers have advanced to practical use. Taking a semiconductor laser as an example, there is a multimode semiconductor laser that achieves an output of several W class, although its output wavelength is limited.

With reduction in size and increase in output power of laser light sources, exploitation of applications as well as development of devices using the small-sized and high-output laser light sources have been intensified.

High-output light sources are expected to be applied to various uses such as image display devices, lighting devices, semiconductor exposure devices, and the like. Particularly, realization of a clear image having high chromatic purity by a laser display using a high-output laser of three primary colors, i.e., R, G, and B, has been sought, utilizing monochromaticity of a high-output laser light source. Further, it is also expected to apply a small-sized and high-output laser light source to a low-power-consumption and long-life light source for lighting. Furthermore, the high-output laser light source is also applied to laser processing, and fine patterning using a high-output laser is being put to practical use.

In these applications using the high-output laser light sources, in addition to utilization of monochromatic characteristics and high-output characteristics of laser light are utilized, there has been strong demand for uniform cross-section light intensity distribution, and therefore, techniques that satisfy this demand have conventionally been proposed.

For example, Japanese Published Patent Application No.Hei.07-306304 (Patent Document 1) and Japanese Patent Publication No.3410813 (Patent Document 2) disclose a method of shaping light outputted from a laser light source having a Gaussian light intensity distribution so as to make the light intensity distribution uniform, using a device for homogenizing the light quantity, which is called a homogenizer. Further, Japanese Published Patent Application No.2002-40327 (Patent Document 3) and Japanese Published Patent Application No.2003-57514 disclose a method for shaping light outputted from a laser light source as described above, using an optical device called an integrator.

DISCLOSURE OF THE INVENTION

Problems to be Solved by the Invention

In the methods disclosed in the conventional Patent Documents 1~3, it is necessary to appropriately increase the cross section area of the output light from the laser light source before it is applied to an optical device or an optical system, and therefore, the optical system including the laser light source is undesirably complicated, resulting in significant increase in the device area. Further, when the output light is applied to the optical device with the cross section area thereof being increased, since the circumference portion of the beam of the output light is cut off, resulting in loss in the light quantity.

Further, in the method disclosed in Patent Document 4, although it is not necessary to increase the cross section area of the output light, the length of the rod integrator in the light propagating direction must be increased, resulting in an increase in the device area.

Furthermore, when using a high-coherent laser light source, light emitted from the optical device for making the light quantity uniform causes minute uneven noise due to a fine interference pattern that is peculiar to laser light, which is called "speckle noise". As a method for removing the speckle noise, there have conventionally been adopted a method of vibrating a screen, and a method of giving temporally and spatially random phases to the laser light by transmitting the laser light through a diffuser. However, the method of vibrating the screen has a problem that the screen cannot be fixed, and the method of using the diffuser has a problem that the light quantity used for image projection is reduced and simultaneously the size of the device is undesirably increased.

The present invention is made to solve the above-described problems and has for its object to provide a compact and high-power laser light source having uniform intensity distribution of emission light, and a two-dimensional image forming device using the laser light source.

Measures to Solve the Problems

In order to solve the above-mentioned problems, a laser light source disclosed in claim 1 of the present invention comprises plural semiconductor lasers, and a waveguide for transmitting light, wherein plural laser beams which are emitted from the plural semiconductor lasers and enter the waveguide propagate in the waveguide to be emitted to the outside from one end face of the waveguide.

Therefore, it is possible to realize a high-power and compact laser light source that can output an emission light having a uniform emission light intensity distribution.

Further, according to claim 2 of the present invention, in the laser light source defined in claim 1, the plural semiconductor lasers are arranged in a direction where spread angles of light beams emitted from the respective semiconductor lasers are relatively small.

Therefore, the length of the laser light source in the light propagating direction can be further reduced, resulting in a more compact laser light source.

Further, according to claim 3 of the present invention, in the laser light source defined in claim 1, a length L from the light emission end face of the waveguide to the nearest light incident position satisfies a relational expression (1) as follows:

$$L \geq W/\tan(\sin^{-1}(\sin(\theta 3/2)/n))$$

wherein W is the width of the waveguide, n is the refractive index in the waveguide, and θ is the minimum beam spread angle of the semiconductor laser.

Therefore, the length in the light propagating direction of the laser light source that has uniform emission light intensity distribution can be minimized, and it is possible to obtain a laser light source that outputs light having uniform emission light intensity distribution, which is minimized as much as possible.

Further, according to claim 4 of the present invention, in the laser light source defined in claim 1, the waveguide has a step difference portion at which the cross-section area of the waveguide varies in the light propagating direction, and the plural semiconductor lasers are disposed on the step difference portion.

Therefore, the plural semiconductor lasers can be easily disposed on the waveguide without the necessity of a support member.

Further, according to claim 5 of the present invention, in the laser light source defined in claim 4, the waveguide has plural step difference portions.

Therefore, the plural semiconductor lasers can be easily disposed on the waveguide without the necessity of a support member. Further, uniformity of the laser light intensity distribution is further promoted, thereby providing a more compact laser light source.

Further, according to claim 6 of the present invention, in the laser light source defined in claim 1, the semiconductor lasers which are arranged in one line along the direction where the spread angles of light beams emitted from the semiconductor lasers are relatively small are shifted from the semiconductor lasers in the other line in the light emission direction.

Therefore, heats of the respective semiconductor lasers can be radiated when the semiconductor lasers emit laser beams, resulting in a laser light source having stable laser output and long life.

Further, according to claim 7 of the present invention, in the laser light source defined in claim 6, the waveguide has step portions at which the cross-section area of the waveguide varies stepwise in the light propagating direction, and the plural semiconductor lasers are disposed on the respective step portions.

Therefore, while keeping sufficient irradiation surfaces of the respective semiconductor lasers, which are in contact with outside air, all the incident laser lights from the respective semiconductor lasers are reflected at the side walls of the waveguide, and almost all of the light amount of the laser light that enters the waveguide is effectively transmitted through the waveguide.

Further, according to claim 8 of the present invention, in the laser light source defined in claim 1, the plural semiconductor lasers include at least two semiconductor lasers having different oscillation wavelengths, and a maximum oscillation wavelength difference A (A: actual number) of the semiconductor lasers having different oscillation wavelengths satisfies $A \geqq 1$ nm.

Therefore, correlation of speckle patterns that are observed due to the semiconductor lasers is reduced, thereby reducing speckle noise that is peculiar to the laser light source.

Further, according to claim 9 of the present invention, in the laser light source defined in claim 8, the plural semiconductor lasers include at least three semiconductor lasers having different oscillation wavelengths, and the intervals of adjacent oscillation wavelengths are substantially constant.

Therefore, speckle noise that is peculiar to the laser light source can be reduced more efficiency.

Further, according to claim 10 of the present invention, in the laser light source defined in claim 8, the maximum oscillation wavelength difference A satisfies $1 \text{ nm} \leqq A \leqq 30$ nm.

Therefore, it is possible to obtain both the effect of reducing speckle noise and the effect of improve color purities of red, blue, and green, respectively.

Further, according to claim 11 of the present invention, in the laser light source defined in claim 1, the output light intensities of the respective semiconductor lasers are approximately uniform.

Therefore, reduction in speckle noise can be achieved.

Further, according to claim 12 of the present invention, in the laser light source defined in claim 1, the plural semiconductor lasers are multistripe lasers.

Therefore, the light output power of the laser light source can easily be enhanced.

Further, according to claim 13 of the present invention, in the laser light source defined in claim 1, the plural semiconductor lasers are multistack lasers.

Therefore, the light output power of the laser light source can easily be enhanced.

Further, according to claim 14 of the present invention, in the laser light source defined in claim 1, the plural semiconductor lasers are arranged so as to constitute at least one laser array.

Therefore, the emission positions of the laser beams emitted from the respective semiconductor lasers and the interval between adjacent semiconductor lasers can be easily controlled, and consequently, fabrication of a high-output laser light source is facilitated.

Further, according to claim 15 of the present invention, in the laser light source defined in claim 1, the waveguide has a hollow structure, and a liquid is sealed in the hollow part.

Therefore, heats generated when the respective semiconductor lasers emit laser beams are efficiently radiated, resulting in a laser light source having stable laser output power and long life.

Further, according to claim 16 of the present invention, in the laser light source defined in claim 15 further includes a cooling mechanism which is connected to the waveguide, and circulates the liquid sealed in the hollow part of the waveguide, and the plural semiconductor lasers are cooled by the cooling mechanism.

Therefore, heats generated when the respective semiconductor lasers emit laser beams can be efficiently radiated.

Further, according to claim 17 of the present invention, there is provided a two-dimensional image forming device including plural semiconductor lasers, a spatial light modulator for modulating light outputted from a laser light source, and a lighting optical system for illuminating the output light from the laser source to the spatial light modulator, and the laser light source comprises plural semiconductor lasers, and a waveguide for transmitting light, wherein plural laser beams which are emitted from the plural semiconductor lasers and enter the waveguide propagate in the waveguide to be emitted to the outside from an end face of the waveguide.

Therefore, a compact two-dimensional image forming device can be realized.

According to claim 18 of the present invention, the two-dimensional image forming device defined in claim 17 further includes a projection optical system for projecting output light from the spatial light modulator.

Therefore, a compact two-dimensional image forming device can be realized.

Effects of the Invention

A laser light source of the present invention is provided with plural semiconductor lasers and a waveguide for transmitting light, and light beams emitted from the respective semiconductor lasers are mixed in the waveguide and outputted. Therefore, it is possible to realize a high-output and compact laser light source that can output emission light having uniform emission light intensity distribution.

Further, the waveguide is provided with a notch part, and the plural semiconductor lasers are disposed on the notch part. Therefore, the respective semiconductor lasers can be easily disposed on the waveguide without the necessity of a support member, and further, the construction of the laser light source can be made more compact.

Furthermore, the plural semiconductor lasers constituting the laser light source are arranged so that the positions of adjacent semiconductor lasers are shifted from each other in the light propagating direction. Therefore, the high-output laser light source is provided with a function of sufficient heat radiation, thereby achieving stable light source output and long life.

Furthermore, the output wavelengths of the semiconductor lasers constituting the laser light source are distributed at appropriate intervals within a specific wavelength range, thereby reducing speckle noise that occurs in a high coherent laser light source.

Moreover, the waveguide adopts a hollow cell structure, and an appropriate liquid is sealed in the cell, whereby heats generated when laser beams are emitted can be efficiently radiated through the waveguide. Furthermore, the liquid in the cell is circulated using a cooling unit is connected to the waveguide of the hollow cell structure, whereby the high-output lasers and the waveguide can be efficiently cooled, resulting in stable light source output and long life.

DESCRIPTION OF REFERENCE NUMERALS

Figure 1A:
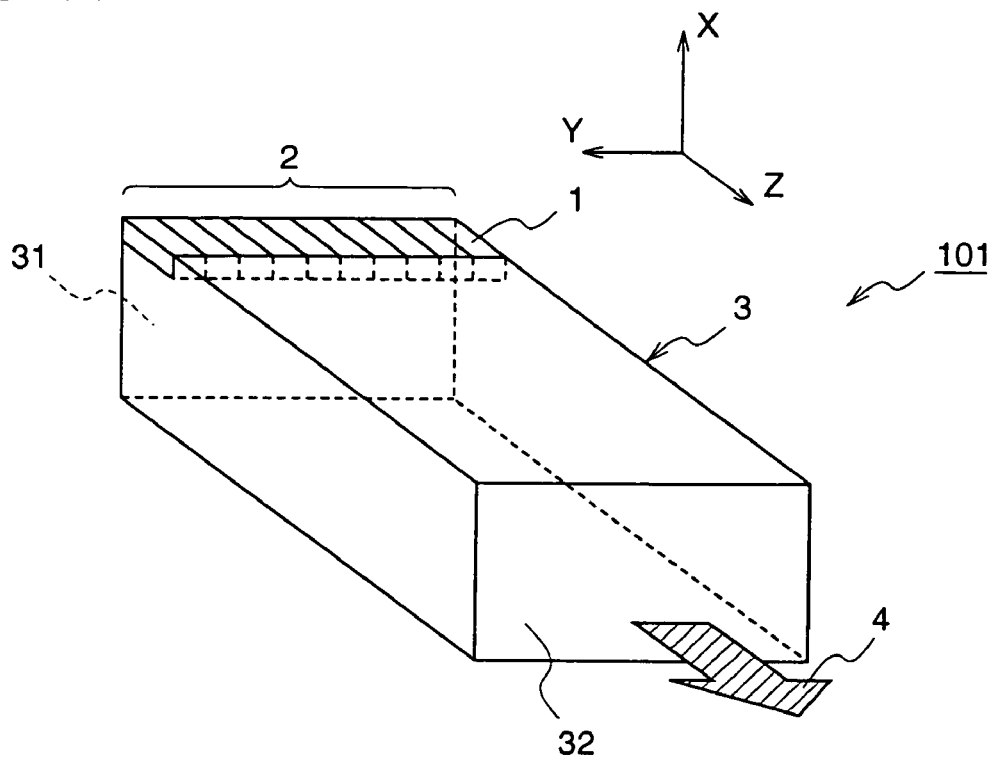
FIGS. 1(a) and 1(b) are a perspective view and a cross-sectional view for explaining a laser light source according to a first embodiment of the present invention.

1 . . . semiconductor laser
1a,L1,L2 . . . laser beams
2, 2a, 2b, 22a, 22b, 32a~32g, 52 . . . laser array
3,40,53 . . . waveguide
4 . . . emitted light
5a,5b . . . prism
11 . . . driving unit
31 . . . incident side end face
32.42 . . . emission face
33 . . . reflection film
34 . . . notch part
54 . . . liquid
101,101a,101b,102,103,104,105 . . . laser light source
160 . . . lighting device
162 . . . liquid crystal panel
163 . . . lens
170 . . . two-dimensional image forming apparatus
171 . . . projection lens
172 . . . screen

BEST MODE TO EXECUTE THE INVENTION

Hereinafter, embodiments of the present invention will be described.

Embodiment 1

According to a first embodiment, a description will be given of a high-power and compact laser light source that outputs light having uniform cross-section intensity distribution, using a semiconductor laser and a waveguide.

Figure 1B:
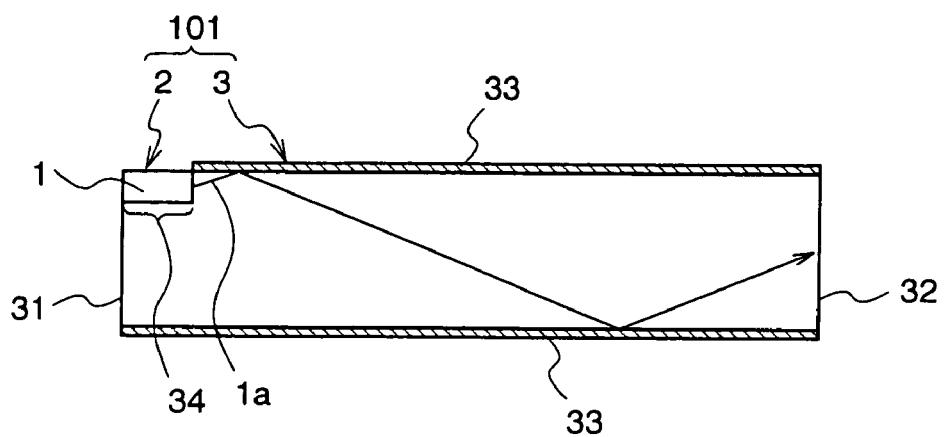

FIG. 1 is a diagram for explaining a laser light source 101 according to the first embodiment of the present invention, and specifically, FIG. 1(a) is a perspective view and FIG. 1(b) is a cross-sectional view.

The laser light source 101 shown in FIG. 1 is composed of a laser array 2 comprising plural semiconductor lasers 1, and a transparent waveguide 3 comprising glass or the like, in which a laser beam 1a emitted from each of the semiconductor lasers propagates. The waveguide 3 is approximately rectangular parallelepiped in shape, and has a notch part 34 on which the laser array 2 can be disposed. The notch part 34 is formed by cutting an upper end portion at a rear surface 31 of the waveguide 3, and serves as a laser beam incident portion of the waveguide 3.

The waveguide 3 has an emission surface 32 from which laser beams outputted from the respective semiconductor lasers 1 are emitted, and a reflection film 33 for confining incident light within the waveguide 3. The reflection film 33 is formed on a part, other than the notch part 34 provided at the upper end of the rear surface 31, of the four side surfaces of the waveguide 3 excluding the emission surface 32 and the rear surface 31 (light incident side end surface) opposed to the emission surface 32. This reflection film 33 is preferably a metal film comprising aluminum or the like.

The plural semiconductor lasers constituting the laser array 2 are arranged in line, along the upper end of the rear surface 31, on the notch part 34 that is formed by cutting out an upper end portion at the rear surface 31 of the waveguide 3.

In FIG. 1, reference numeral 4 denotes an emission laser beam that is emitted from the waveguide, X denotes a vertical direction of the waveguide 3, Y denotes a direction in which the semiconductor lasers 1 are arranged, i.e., a width direction of the waveguide, and Z denotes a direction along which the light propagates in the waveguide.

Next, the function and effect will be described.

Initially, a description will be given of the reason why a high-output laser light source having uniform cross-section intensity distribution of emission light can be realized using the semiconductor lasers and the waveguide.

The laser beams emitted from the semiconductor lasers 1 constituting the laser array 2 enter the waveguide 3. The incident laser beams propagate in the waveguide while repeating total reflection, and are outputted as emission light 4 from the waveguide 3. At this time, the laser beams that enter the waveguide 3 have the respective Gaussian cross-section light intensity distributions at a point in time when the laser beams are emitted from the respective semiconductor lasers 1. However, as the laser beams propagate in the waveguide while repeating multiple reflection, the cross-section light intensity distributions are made uniform. That is, the plural laser beams emitted from the respective semiconductor lasers 1 are mixed, whereby the light intensity distribution viewed at a plane perpendicular to the light propagating direction of the waveguide 3 is gradually made uniform in the plane with distance from the light incident surface in the light propagating direction.

Accordingly, uniform cross-section light intensity can be obtained at the emission end surface by setting the length of the waveguide 3 in the light propagating direction to an appropriate value.

Figure 2:
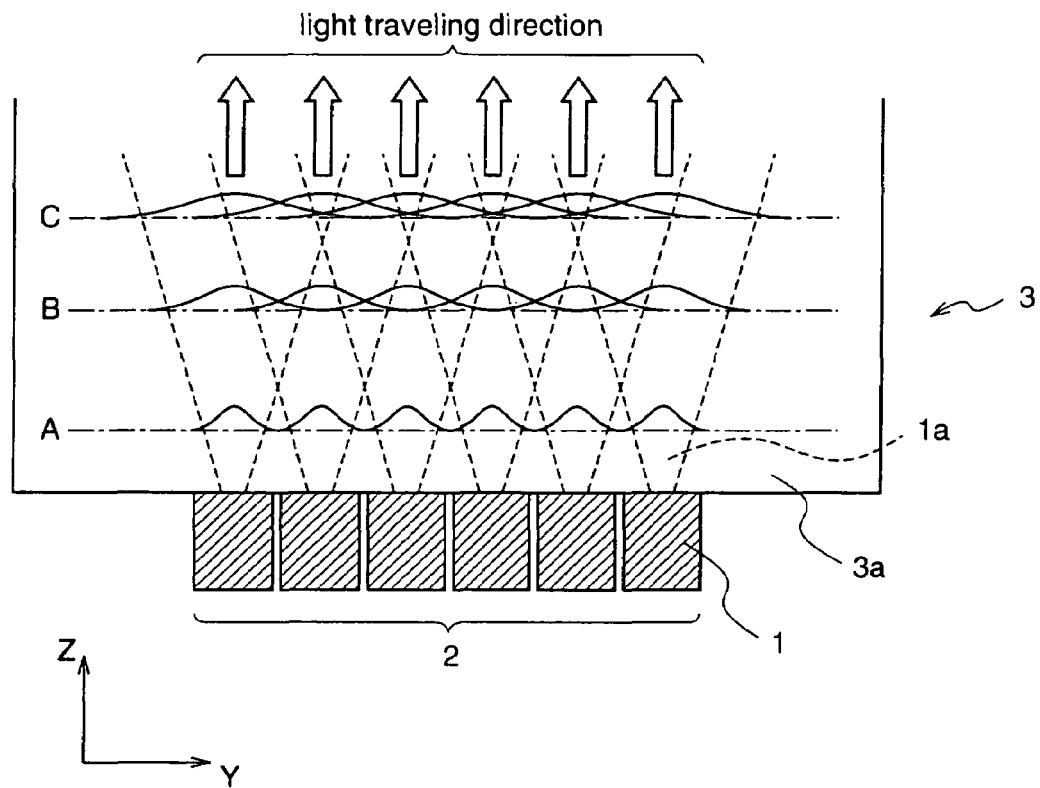
FIG. 2 is a diagram for explaining the operation of the laser light source of the first embodiment, schematically illustrating light intensity distributions of plural laser beams from the laser light source.

FIG. 2 is a schematic diagram illustrating how the plural laser beams from the laser array are mixed while propagating in the waveguide.

With reference to FIG. 2, in an area 3a in the waveguide, the plural laser beams 1a emitted from the plural semiconductor lasers 1 of the laser array 2 are mixed while propagating in the waveguide, whereby the light intensity distribution is made uniform.

More specifically, in a plane A which is close to the laser array 2 and perpendicular to the light propagating direction Z in the waveguide, the laser beams emitted from the respective semiconductor lasers are not mixed. In a plane B which is separated from the laser array 2 and perpendicular to the light propagating direction Z, the light intensity distribution is made uniform to a certain extent due to mixing of the output beams from the adjacent semiconductor lasers. Further, in a plane C which is distant from the laser array 2 and perpendicular to the light propagating direction Z, the light intensity distribution is made more uniform due to mixing of the output beams from the adjacent semiconductor lasers. In FIG. 2, for simplification, reflections of the laser beams at the side surfaces of the waveguide are not considered.

As described above, the intensity distributions of the laser beams emitted from the plural semiconductor lasers are made uniform as the laser beams propagate in the waveguide.

Although, in the description of FIG. 2, reflections of the laser beams at the side surfaces of the waveguide are not considered, when the width of the waveguide (the dimension in the Y direction) is approximately equal to the width of the laser array 2, since the laser beams reaching the side surfaces of the waveguide are total-reflected, the light intensity distribution in the waveguide is folded at the side surfaces of the waveguide, whereby mixing of the laser beams from the respective semiconductor lasers are further complicated to be promoted.

Further, from the aspects of device fabrication and device utilization, the laser light source is desired to be as compact as possible. For this purpose, the length of the waveguide 3 is desired to be as short as possible. Therefore, a description will be hereinafter given of a length of the waveguide 3, which realizes uniformization of light intensity with a distance as short as possible.

As described above, in the laser light source 101 according to the first embodiment, since the length of the waveguide 3 in the light propagating direction (Z direction) is a main cause that determines the size of the laser light source 101, the length of the waveguide 3 in the light propagating direction must be reduced as possible.

Figure 3:
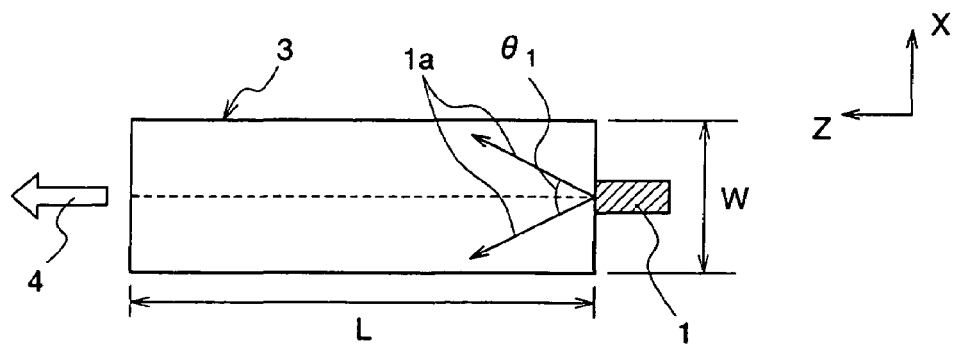
FIG. 3 is a diagram for explaining the operation of the laser light source of the first embodiment, geometric-optically illustrating a light beam propagating in the waveguide.

FIG. 3 is a diagram geometric-optically illustrating an optical path along which an emission light beam 1a from a single semiconductor laser 1 propagates in the waveguide 3. FIG. 3 shows, for simplification, the state where an emission light beam from a single semiconductor laser 1 propagates in the waveguide.

In FIG. 3, $\theta 1$ denotes the spread angle of the laser beam 1a in the waveguide 3, and it is expressed by a full angle at half maximum of the light intensity distribution. Further, W denotes the width of the waveguide 3 in the laser beam spreading direction, and L denotes the length from the laser light incident surface to the emission surface of the waveguide 3.

When the light beam 1a emitted from the semiconductor laser is applied to the waveguide 3, a portion of the incident light is reflected at the side surface of the waveguide 3. Accordingly, inside the waveguide, a light intensity distribution which is obtained by overlapping the light intensity distribution in the free space on a light intensity distribution which is obtained by folding the light intensity distribution in the free space at the side wall of the waveguide, is obtained.

FIG. 4 is a diagram illustrating how the light intensity distribution is made uniform by reflection of the laser beam at the side wall of the waveguide 3.

Figure 4A:
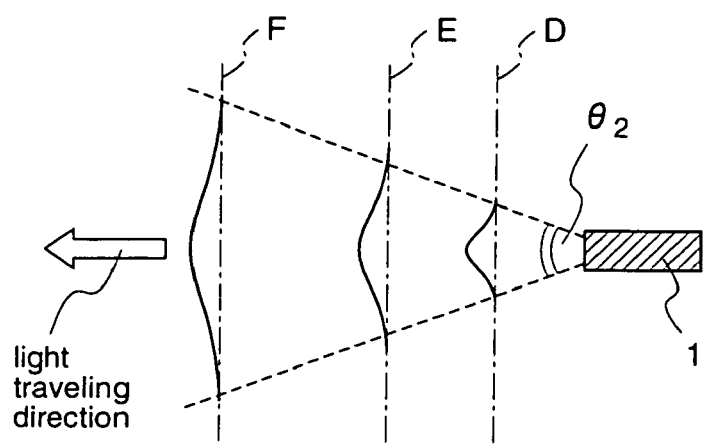
FIG. 4 is a diagram for explaining the operation of the laser light source of the first embodiment, illustrating uniformization of light intensity distribution of laser light in the waveguide (4(b) and 4(c)) in contrast to variation in light intensity distribution of laser light in a free space (4(a)).
Figure 4B:
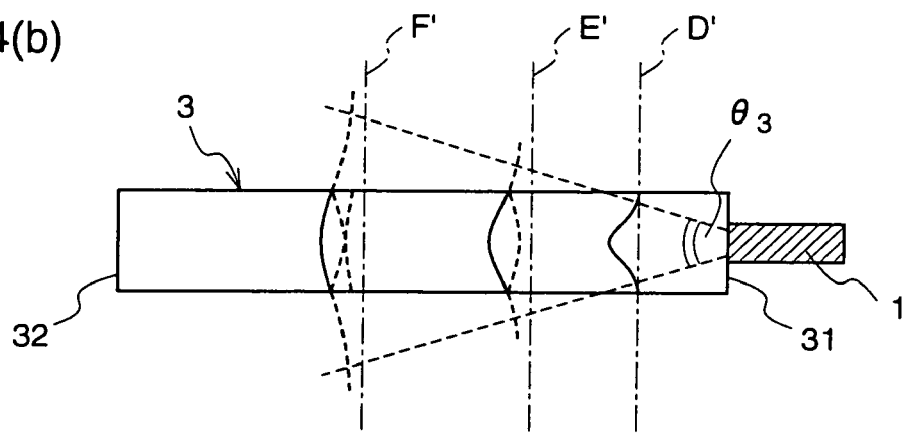
Figure 4C:
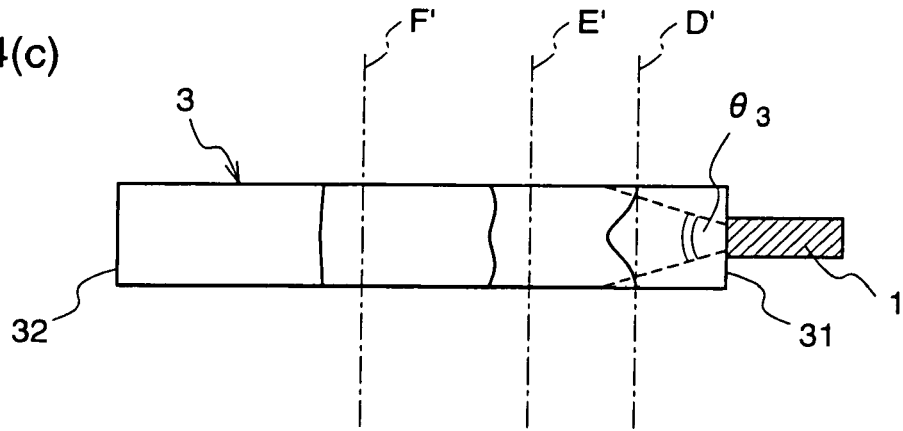
Figure 5:
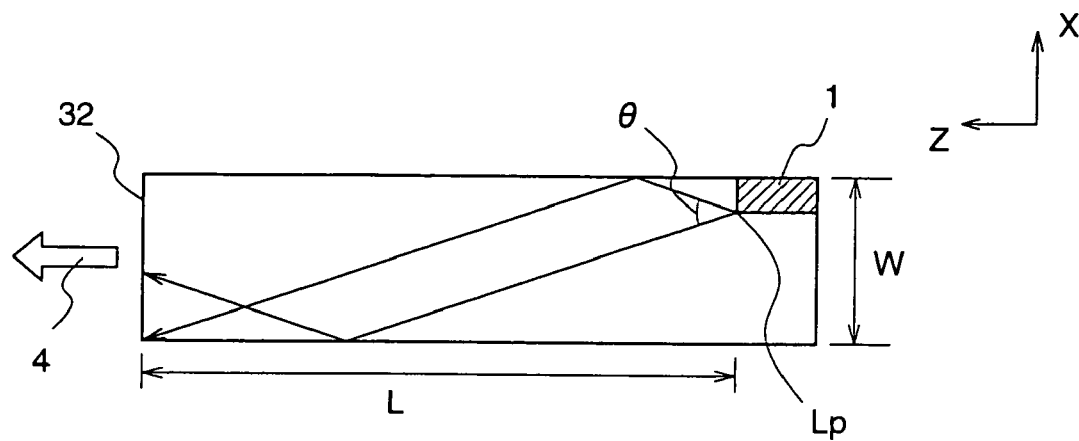
FIG. 5 is a diagram for specifically explaining an optical path along which laser light propagates in the waveguide of the laser light source according to the first embodiment.

FIG. 4(a) shows the intensity distribution in the case where the laser beam propagates in the free space, FIG. 4(b) shows the overlapping state of the light intensity distributions at the side wall of the waveguide when the laser light propagates in the waveguide, and FIG. 4(c) shows the light intensity distribution that is obtained by the overlapping of the light intensity distributions. In FIG. 4, reference numeral 1 denotes a semiconductor laser, and numeral 3 denotes a waveguide comprising a transparent material having a refraction index n. Further, $\theta 3$ denotes the spread angle of the laser beam in the waveguide having the refraction index n, and $\theta 2$ denotes the spread angle of the semiconductor laser beam in the free space.

With reference to FIG. 4(a), the light emitted from the semiconductor laser 1 and propagating in the free space gradually spreads with the spread angle θ2 as it propagates in the waveguide. While the spatial spreading of the emission light from the semiconductor laser 1 increases in the free space as described above, its light intensity distribution does not change, and the cross-section intensity distribution maintains the Gaussian type intensity distribution.

To be specific, the light intensity distribution is observed as the Gaussian distribution in any of the following planes: a plane D which is perpendicular to the light propagating direction and close to the semiconductor laser 1, a plane F which is perpendicular to the light propagating direction and distant from the semiconductor laser 1, and a plane E which is perpendicular to the light propagating direction and positioned between the planes D and F.

On the other hand, as shown in FIGS. 4(b) and 4(c), the emitted light from the semiconductor laser 1, which propagates in the waveguide 3, is total-reflected at the side surfaces of the waveguide 3. In this case, the spread angle θ3 of the laser beam incident on the waveguide 3 having the refractive index n is expressed by $$\theta 3 = 2 \times \sin^{-1}((\sin(\theta 2/2))/n)$$

Assuming that the width of the waveguide 3 is W, when the light beam that enters the waveguide 3 reaches a position where the distance from the incident surface is $W/(2 \times \tan(\sin^{-1}(\sin(\theta 2/2)/n)))$, a portion of the light intensity distribution thereof starts to be reflected at the side surfaces of the waveguide 3. When the incident light beam exceeds this position, the intensity distribution of the reflected light gradually increases. Until the light beam reaches the emission surface 32 of the waveguide 3, as shown in FIG. 4(a), the light intensity distribution obtained in the case where the light propagates in the free space is folded and overlapped at portions corresponding to the side walls of the waveguide, and this light intensity distribution is observed (FIG. 4(b)).

At this time, in order to make the substantial cross-section light intensity (FIG. 4(c)) sufficiently uniform, the length of the waveguide 3 should be sufficiently long to increase the number of total reflections. However, from the aspects of device fabrication and utilization, it is desired that the laser light source should be as compact as possible. According to our study on the length L of the waveguide required for making the light intensity distribution of the laser beam in the waveguide 3 uniform, it was discovered that the light intensity distribution is made uniform so long as at least the condition of formula (1) as follows is satisfied.

$$L \geq W/\tan(\sin^{-1}(\sin(\theta 3/2)/n)) \qquad (1)$$

wherein θ3 is the spread angle of the emitted laser light, n is the refractive index in the waveguide, and W is the width of the waveguide.

By the way, not only the length of the waveguide 3 in the light propagating direction but also the way of disposition of the laser array with respect to the waveguide 3 have influences on miniaturization of the device. For example, general semiconductor lasers (e.g., AlGaAs, AlGaInP, and GaN semiconductor lasers) have different aspect ratios and different spread angles of emission light, and these lasers have relatively large spread angles in the vertical direction (X direction in FIG. 1). Accordingly, when using a waveguide having a cross-section aspect ratio of approximately 1, the waveguide length required for making the cross-section intensity distribution uniform in the direction where the spread angle is relatively large must be short while the waveguide length in the direction where the spread angle is relatively smaller must be long. Therefore, we have discovered that, when the plural semiconductor lasers are arranged in the direction where the spread angle is relatively small (Y direction) to constitute the laser array 2 as shown in FIG. 1, the laser beams oscillated from the respective semiconductor lasers can easily be mixed within the plane perpendicular to the X direction, whereby the cross-section light intensity distribution of the emission light 4 can be made uniform within a very short distance.

However, since the semiconductor lasers 1 are disposed inside the waveguide 3 in this first embodiment, the value L expressed in formula 1 corresponds to a distance from the incident position Lp of the laser beam emitted from the semiconductor laser 1 in the waveguide 3 to the emission surface 32 of the waveguide 3.

Next, a description will be given of a fabrication process of the laser light source 101 according to the first embodiment.

The laser array 2 is fabricated using a semiconductor process. Thereby, it is possible to easily control the emission positions of laser beams emitted from the respective semiconductor lasers as well as the interval between adjacent semiconductor lasers 1.

The waveguide 3 is fabricated as follows. A quartz glass which satisfies the above-mentioned conditions for lengths in the thickness direction X, width direction Y, and light propagating direction Z is prepared, and an upper end portion of the quartz glass at one end surface that is perpendicular to the light propagating direction of the waveguide 3 is cut out using high-precision machining process and grinding process, thereby forming a notch part 34 in which the laser array 2 can be incorporated. The above-mentioned processing of the waveguide 3 can also be carried out at high precision using dry etching.

Then, the laser array 2 is adhered to the notch part 34 of the waveguide 3 by using resin or solder.

When the waveguide 3 satisfies the total reflection condition with respect to the light that propagates therein, the reflection film 33 may be dispensed with. Also in this case, low-loss light propagation can be carried out.

As described above, according to the first embodiment, the laser light source 101 includes the laser array 2 comprising the plural high-output semiconductor lasers 1 arranged in line, and the waveguide 3 in which the laser beams emitted from the respective semiconductor lasers 1 propagate. Therefore, it is possible to output high-power laser light having uniform cross-section light intensity.

Furthermore, according to the first embodiment, since the laser array 2 is constituted by arranging the plural semiconductor lasers 1 along the direction where the spread angle of the light beam emitted from each semiconductor laser is relatively small, the light intensity distribution is made uniform due to mixing of the light beams emitted from the adjacent semiconductor lasers in the semiconductor laser arrangement direction. As the result, the length of the waveguide 3 in the light propagating direction, which is required for making the intensity distribution of the emitted laser beams uniform, can be reduced, whereby the size of the laser light source 101 can be further reduced.

Furthermore, according to the first embodiment, it is possible to realize a compact laser light source 101 having uniform intensity distribution of emission light 4 by setting the refractive index n in the waveguide 3, the width W of the waveguide 3, the spread angle θ of the laser light, and the length L from the light incident face to the light emission face 32 of the waveguide 3 so as to satisfy the relational expression, $L \geq W/\tan(\sin^{-1}(\sin(\theta 3/2)/n))$.

While in this first embodiment the laser light source having a single laser array has been described, the construction and arrangement of the laser array in the laser light source are not restricted to those of the first embodiment.

Figure 6:
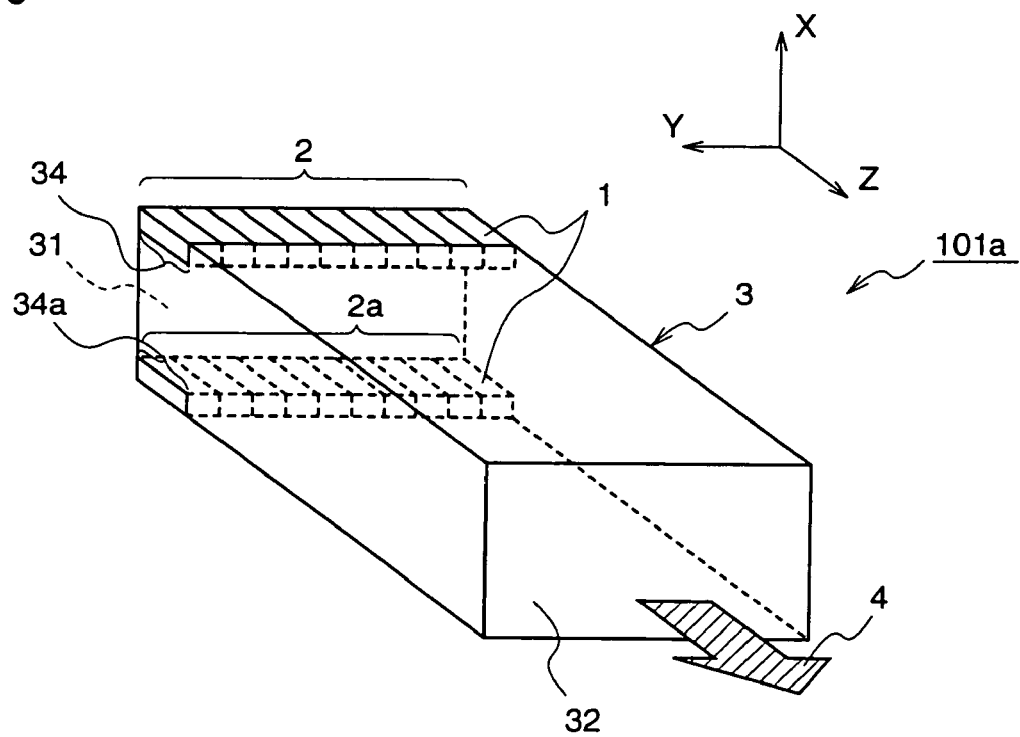
FIG. 6 is a perspective view illustrating an example in which the laser light source of the first embodiment is provided with an additional laser array.

FIG. 6 is a diagram for explaining another example of a laser light source according to the first embodiment.

The laser light source 101a shown in FIG. 6 is different from the laser light source 101 according to the first embodiment in that another notch part 34a is formed in a lower end portion on the rear surface side of the waveguide so that the notch part 34a is opposed to the laser array 2 positioned at the upper end portion on the rear surface side, and another laser array 2a is disposed on the notch part 34a at the lower end on the rear surface side.

In the laser light source 101a, the laser beams outputted from the upper and lower laser arrays positioned at the rear surface 31 side of the waveguide 3 are mixed in the waveguide, and therefore, uniformization of the intensity distribution of the laser light is further promoted as compared with the laser light source 101 having only one laser array as shown in FIG. 1. As the result, the length of the waveguide 3 of the laser light source 101a can be shorter than that of the laser light source 101.

Figure 7:
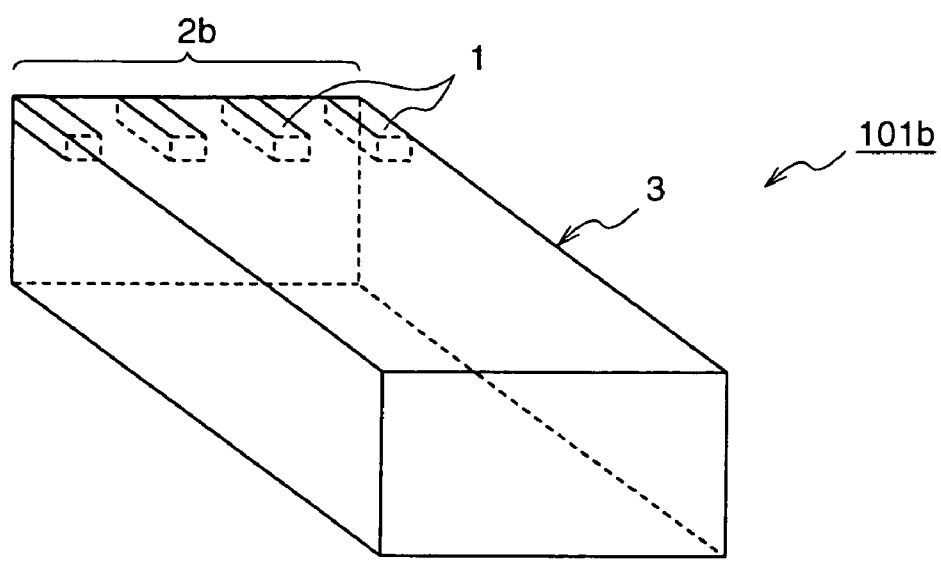
FIG. 7 is a perspective view illustrating plural semiconductor lasers constituting the laser light source of the first embodiment, which are arranged at intervals.

FIG. 7 is a diagram illustrating still another example of a laser light source according to the first embodiment.

The laser light source 101b shown in FIG. 7 has a laser array 2b in which semiconductor lasers 1 are disposed evenly spaced apart from each other.

Also in this laser light source 101b, the laser beams outputted from the plural semiconductor lasers constituting the laser array are mixed in the waveguide, thereby realizing high output power of the laser light source as well as uniformization of light intensity distribution.

Further, while in this first embodiment the placement interval and the number of the semiconductor lasers 1 constituting the laser array are not specifically described, the aspect ratio and the emission light intensity at the emission face of the waveguide 3 can be arbitrarily designed by adjusting the placement interval or the number of the semiconductor lasers 1.

For example, the laser light source according to the first embodiment may employ, as semiconductor lasers constituting a laser array, a multi-stripe laser which is a single laser chip having plural light-emitting points, or a multi-stack laser in which semiconductor laser parts are accumulated in a stack.

Further, while in this first embodiment one or plural notch parts 34 are provided along the end face on the rear surface 31 side of the waveguide 3, the position where the notch part is provided is not restricted thereto.

Furthermore, the laser light source of the present invention is not restricted to that described for the first embodiment in which the notch part 34 is formed by removing a portion of the waveguide 3 and the laser array 2 is disposed on the notch part 34. For example, the notch part 34 of the waveguide 3 may be dispensed with, or the laser array 2 may be disposed with its laser light emission face facing the rear surface 31 of the waveguide 3. In this case, however, a member for supporting the laser array 2 is required. Alternatively, the laser array 2 may be disposed on the upper or lower surface of the waveguide 3.

Embodiment 2

FIG. 8 is a diagram for explaining a laser light source according to a second embodiment of the present invention.

Figure 8A:
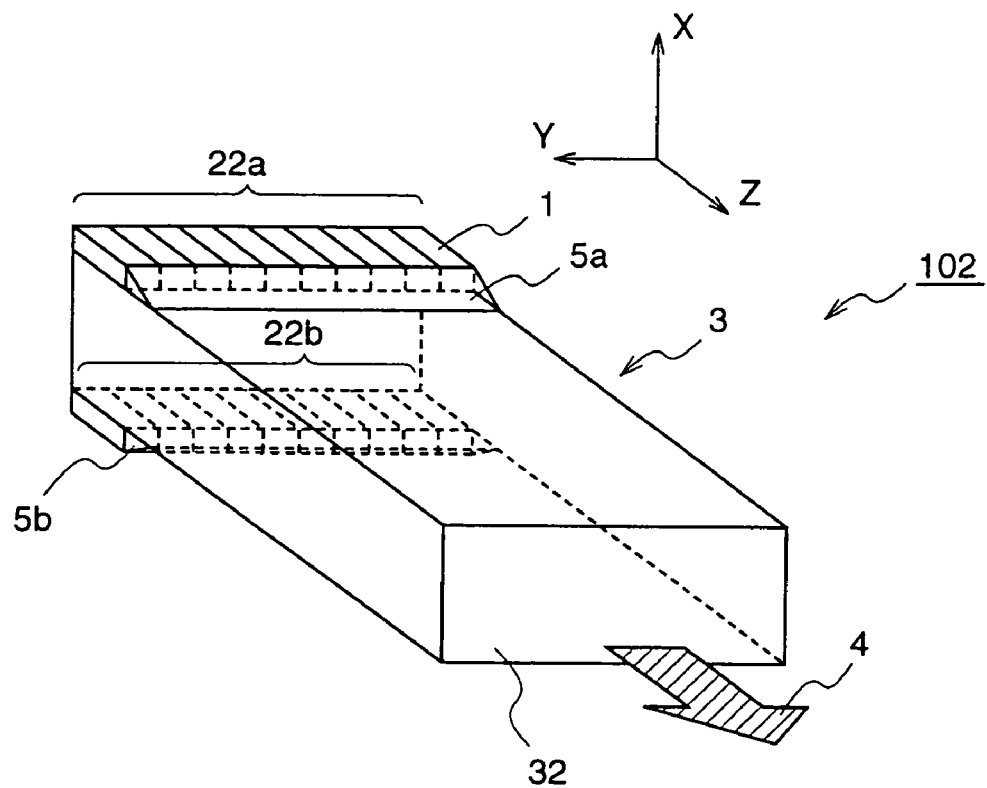
FIGS. 8(a) and 8(b) are a perspective view and a cross-sectional view for explaining a laser light source according to a second embodiment of the present invention.
Figure 8B:
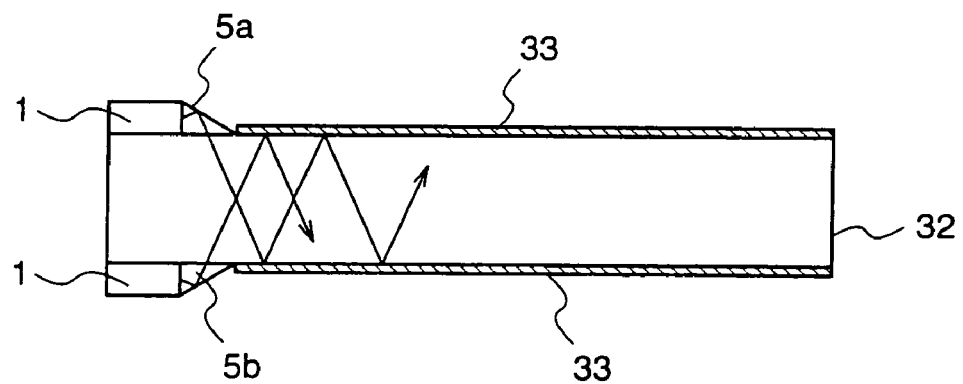

More specifically, FIG. 8(a) is a perspective view of the laser light source, and FIG. 8(b) is a cross-sectional view thereof.

The laser light source 102 according to the second embodiment includes first and second laser arrays 22a and 22b each comprising plural semiconductor lasers 1, a transparent waveguide 3 comprising glass or the like, in which laser beams emitted from the respective semiconductor lasers propagate, and first and second prisms 5a and 5b which introduce the laser beams emitted from the semiconductor lasers 1 of the respective laser arrays into the waveguide 3.

The waveguide 3 is approximately rectangular parallelepiped in shape. A reflection film 33 for confining the incident light within the waveguide 3 is disposed on the four side surfaces of the waveguide 3 excluding the emission surface 32 for emitting the laser beams from the respective semiconductor lasers 1 and the rear surface 31 opposite to the emission surface 32, except the regions where the laser arrays 22a and 22b and the prisms 5a and 5b are disposed.

Further, the first laser array 22a is disposed on the upper surface of the waveguide 3 along the upper end of the rear surface 31, and the second laser array 22b is disposed on the lower surface of the waveguide 3 along the lower end of the rear surface 31. The prism 5a is disposed on the upper surface of the waveguide 3 at the light emission side of the laser array 22a, and the laser beams from the laser array 22a are reflected at the prism 5a to enter the waveguide 3. The prism 5b is disposed on the lower surface of the waveguide 3 at the light emission side of the laser array 22b, and the laser beams from the laser array 22b are reflected at the prism 5b to enter the waveguide 3.

In the laser light source 102 of the second embodiment constructed as described above, the laser arrays 22a and 22b are disposed on the upper and lower surfaces of the waveguide, respectively, and the laser beams emitted from the laser arrays 22a and 22b are reflected by the prisms 5a and 5b that are disposed on the emission face side of the respective laser arrays, thereby introducing the laser beams into the waveguide 3. Therefore, it is not necessary to secure a space for embedding the laser array 2 in the waveguide 3 by processing the waveguide 3, whereby fabrication of the laser light source 102 is simplified.

While in this second embodiment the laser array 22 and the prism 5 are disposed along the upper end of the rear surface 31 of the waveguide 3, the position where the laser array 22 and the prism 5 are disposed is not restricted thereto. The laser array 22 and the prism 5 may be disposed at any position so long as the light beams emitted from the laser array 22 can be introduced into the waveguide 3.

Further, while in the respective embodiments the reflection film 33 is formed on the surfaces of the waveguide 3 except for the light emission surface 32 and the surface 31 parallel to the light emission surface, the reflection film 33 may be dispensed with when the waveguide 3 satisfies the total reflection condition for the light beams propagating therein. Also in this case, low-loss light propagation can be achieved.

Further, while in the above-mentioned embodiments the laser light source is provided with one or two laser arrays, the laser light source may be provided with three or more laser arrays. The output power of the laser light source can be increased with increase in the number of laser arrays provided in the laser light source. In this case, the plural laser arrays may be stacked so that the laser arrays are opposed to the entire surface of the rear side of the waveguide.

In this case, however, the laser array 2 generates high heat when it emits laser beams. Therefore, heat radiation during laser beam emission is a serious problem in view of output stability and lifetime of the light source.

So, a description will be hereinafter given of a laser light source of a third embodiment of the present invention, which solves the problem of heat radiation.

Embodiment 3

Figure 9A:
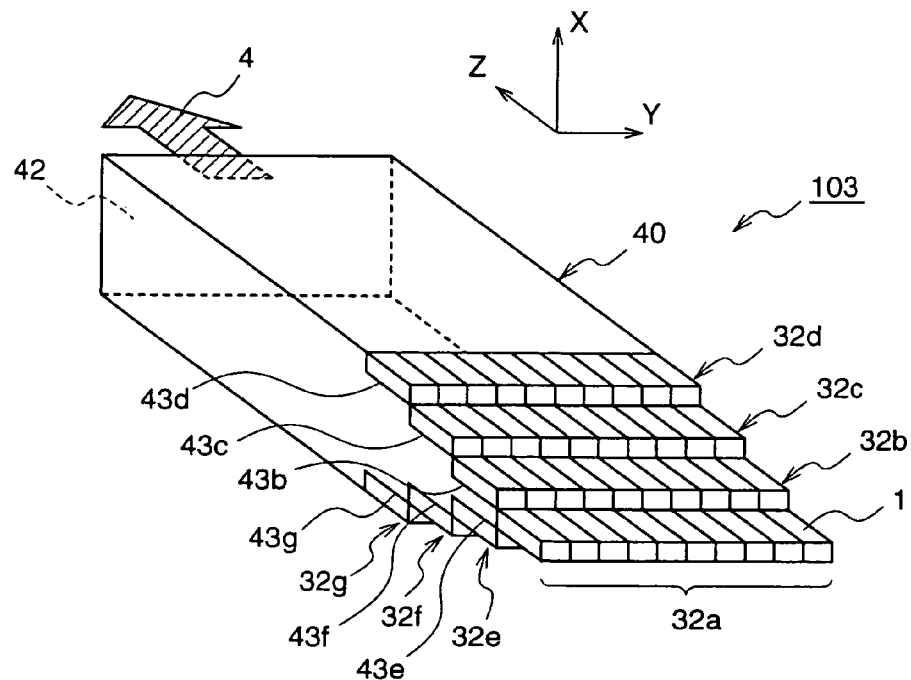
FIGS. 9(a) and 9(b) are a perspective view and a cross-sectional view for explaining a laser light source according to a third embodiment of the present invention.
Figure 9B:
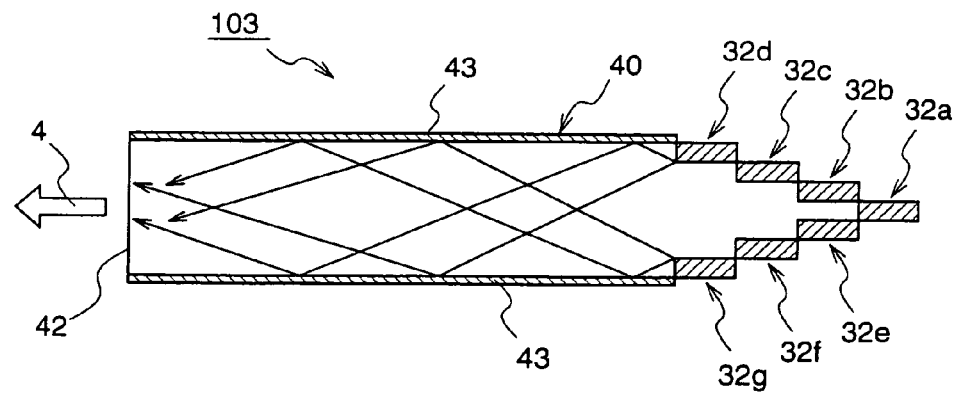

FIG. 9 is a diagram for explaining a laser light source according to the third embodiment of the present invention, wherein FIG. 9(a) is a perspective view and FIG. 9(b) is a cross-sectional view.

The laser light source 103 according to the third embodiment includes plural laser arrays 32a~32g each comprising plural semiconductor lasers 1 arranged in line, and a transparent waveguide 40 comprising glass or the like, in which laser beams emitted from the respective semiconductor lasers 1 propagate.

In this third embodiment, the laser arrays 32a~32g are disposed on the light incident side end surface of the waveguide 40 that is approximately rectangular parallelepiped in shape, and the incident side end face is on the opposite side of the light emission end face. Further, the respective laser arrays 32a~32g are shifted stepwise in the light emitting direction Z so that the laser beam emission faces thereof which are closer to the upper or lower end of the waveguide are disposed closer to the light emission end face 42 of the waveguide 40. That is, in this third embodiment, the light incident side end face of the waveguide 40 is shaped stepwise so that the light emission end faces of the respective laser arrays are shifted in the light emitting direction. In FIG. 9, reference numerals 43b~43g denote the respective step portions of the stepwise pattern formed at the light incident side end face of the waveguide 40.

Next, the function and effect will be described.

Initially, a description will be given of the high-power output function of the laser light source 103 according to the third embodiment. As shown in FIG. 9, since the laser light source 103 according to the third embodiment includes plural layer arrays each comprising plural high-output semiconductor lasers 1 arranged in line, the output power of the emission light 4 emitted from the laser light source 103 must be considerably high. Further, as described above, in this third embodiment, the thickness of the light emission end part of the waveguide 40 varies stepwise within the plane perpendicular to the waveguide width direction. Therefore, the semiconductor lasers included in one laser array disposed on the stepwise part are not hidden behind the semiconductor lasers 1 of another laser array, and the incident laser beams from the respective semiconductor lasers 1 are total reflected at the walls of the waveguide 40, thereby preventing loss in light quantity. Accordingly, most of the quantity of the laser light that enters the waveguide 40 can be efficiently propagated in the waveguide 40.

As for the function of making the light intensity distribution of the laser light source 103 uniform, as described for the first embodiment, the number of total reflections of light in the waveguide 40 increases with increase in the length of the waveguide 40 in the light propagating direction, and the cross-section light intensities of the laser beams emitted from the plural semiconductor lasers 1 are sufficiently made uniform until reaching the emission face 42 of the waveguide 40.

Figure 10:
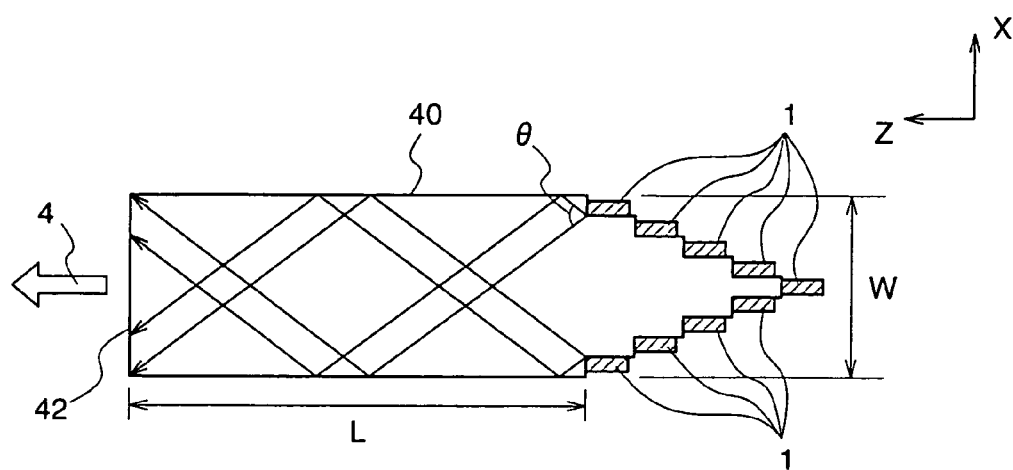
FIG. 10 is a diagram for geometric-optically illustrating an optical path along which laser light propagates in the waveguide of the laser light source according to the third embodiment.

Further, when the length of the waveguide 40 in the light propagating direction is set at the value L in formula (1) according to the first embodiment, the laser light source 103 can be reduced in size. In this third embodiment, however, since the plural laser arrays are disposed on the stepwise-processed portions at the end face of the waveguide, the value L expressed by formula (1) becomes the length from the light emission face of the semiconductor laser that is closest to the light emission face 42 of the waveguide, to the light emission face 42 of the waveguide 40, as shown in FIG. 10.

Further, as described for the first embodiment, since the light intensity is likely to be made uniform as the spread angle of the light emitted from the semiconductor laser is larger, the dimension (width) of the waveguide 40 in the direction where the light spread angle is relatively small is increased to increase the number of semiconductor lasers disposed in that direction, whereby the light intensity can be made uniform within a shorter distance.

Next, the heat radiating function of the laser light source 103 will be described.

As for heat radiation of the semiconductor lasers 1, it is generally considered that efficient heat radiation can be performed when each semiconductor lasers 1 is fixed to a heat radiating substrate comprising a material having high heat conductivity such as a silicon submount so that the semiconductor laser 1 contacts the heat radiating substrate at a plane parallel to an active layer of the semiconductor laser 1. Accordingly, in order to perform more efficient heat radiation, the surface of the semiconductor laser which is perpendicular to the X direction should be the heat radiating plane. However, when the laser beam emission faces of the laser arrays which are accumulated in a stack are within approximately the same plane, heat radiation is deteriorated, and efficient elimination of generated heat cannot be achieved.

So, as shown in FIG. 9, the laser emission face positions of at least adjacent laser arrays 32a~32g are shifted in the light propagating direction to expose the surfaces of the laser arrays 32a~32g which are perpendicular to the X direction, whereby measures for heat radiation can be easily taken, and the generated heat can be eliminated more efficiently.

In an experiment, one laser array is shifted from an adjacent laser array by a predetermined length (several 100 μm~several mm in a common high-output laser) in the light propagating direction of the waveguide 40, thereby providing a compact and high-output laser light source that achieves most efficient heat radiation.

Of course in this third embodiment, like the first embodiment, a reflection film 43 for confining incident light within the waveguide 40 may be formed on the four surfaces of the waveguide 3, i.e., the surfaces of the waveguide 40 excluding the light incident surface to which the laser beams are applied and the light emission surface from which the laser beams are outputted. This reflection film is preferably a metal film comprising aluminum or the like.

Next, the fabrication process of the laser light source 103 of this third embodiment will be described.

The laser arrays 32a~32g are fabricated by semiconductor processing. Thereby, the emission positions of the laser beams from the respective semiconductor lasers 1 and the interval between adjacent semiconductor lasers 1 can be easily controlled.

The waveguide 40 is fabricated as follows. A quartz glass that clears the above-mentioned lengths in the thickness direction X, width direction Y, and light propagating direction Z is prepared, and the quartz glass is processed by high-precision machining process and grinding process so that the cross-section of the light incident side end portion of the waveguide 40 has a stepwise pattern as shown in FIG. 9.

If the walls of the waveguide 40 are desired to be covered with a reflection film, a metal film such as aluminum is formed on the surfaces of the waveguide 40 other than the light incident surface and the light emission surface 42.

Thereafter, the laser arrays 32a~32g are adhered to the processed light incident side end portion of the waveguide 40 by using resin or solder.

As described above, according to the third embodiment, the laser light source 103 is provided with the plural laser arrays 32a~32g each comprising the plural semiconductor lasers 1 arranged in line, and the waveguide 40 in which the laser beams emitted from the respective semiconductor lasers 1 propagate. Therefore, it is possible to provide a laser light source which can output, at higher output power, laser light having uniform cross-section light intensity.

Further, according to the third embodiment, since the plural laser arrays 32a~32g are arranged so that the light emission faces thereof are shifted along the light emission direction to prevent the adjacent laser arrays from contacting with each other, heat generated from the respective semiconductor lasers 1 can be efficiently removed. Further, when the length by which each laser array is shifted with respect to the adjacent laser array is equal to the length of the laser array in the Z direction (several 100 μm~several mm in a common high-output laser), a compact high-output laser light source 103 can be realized at highest efficiency.

Further, since the light incident side end portion of the waveguide 40 is patterned stepwise and the plural laser arrays 32a~32g are disposed on the step portions, the semiconductor lasers 1 of any laser array are not hidden behind the semiconductor lasers 1 of another laser array, thereby realizing a low-loss laser light source which can efficiently propagate the incident laser light in the waveguide 40 without inviting loss in light quantity.

Although in this third embodiment the placement interval and the number of the semiconductor lasers 1 constituting the laser array 2 are not specifically described, the aspect ratio and the emission light intensity at the emission face of the waveguide 40 can be arbitrarily designed by adjusting the placement interval or number of the semiconductor lasers 1.

Embodiment 4

Figure 11:
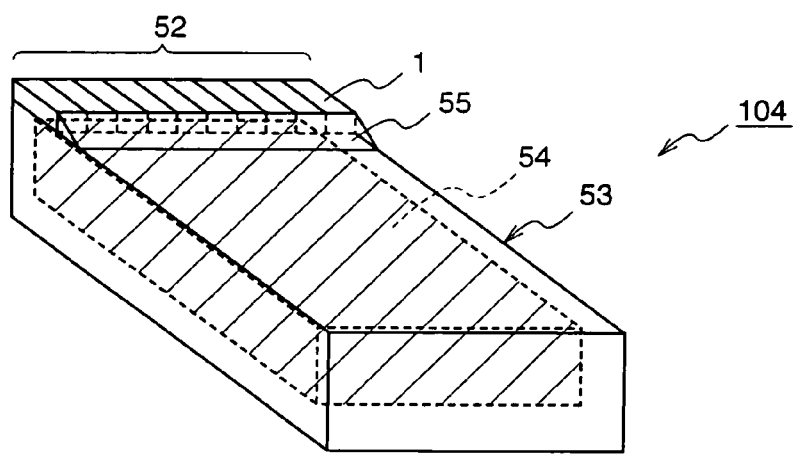
FIG. 11 is a perspective view for explaining a laser light source according to a fourth embodiment of the present invention.

FIG. 11 is a perspective view for explaining a laser light source according to a fourth embodiment of the present invention.

The laser light source 104 according to the fourth embodiment includes a laser array 52 comprising plural semiconductor lasers 1, a transparent waveguide 53 comprising glass or the like in which laser beams emitted from the respective semiconductor lasers propagate, and a prism 55 for introducing the laser beams outputted from the respective semiconductor lasers 1 into the waveguide 53.

The laser array 52 is disposed on the upper surface of the waveguide 53 that is approximately rectangular parallelepiped in shape, along the upper end of the rear surface side of the waveguide 53. Further, the prism 55 is disposed on the upper surface of the waveguide 53 on the light emission face side of the laser array 52, and reflects the laser beams from the laser array to introduce the laser beams into the waveguide. The waveguide 53 has a hollow structure, and a liquid that is transparent in the wavelength range of the employed semiconductor lasers 1 is sealed in the waveguide 53. Further, the waveguide 53 and the laser array 52 are adhered to each other with a reduced thermal resistance at the adhesion plane so that the heat generated by the semiconductor lasers 1 is efficiently transferred to the waveguide.

In the laser light source 104 thus constructed, the laser beams emitted from the respective semiconductor lasers of the laser array propagate in the waveguide while repeating reflection, whereby the laser beams from the respective semiconductor lasers are efficiently mixed. Therefore, it is possible to obtain a laser light source 104 that realizes uniformization of the cross-section light intensity of the emission light from the laser light source.

Further, in the laser light source 104 of this fourth embodiment, since the liquid sealed in the waveguide 53 is convected, the heat radiation efficiency is further improved.

While in this fourth embodiment the laser light source 104 has the waveguide 53 of the hollow cell structure and a liquid is sealed in the waveguide 53, the laser light source 104 may have a hollow waveguide in which a liquid is sealed, and a cooling mechanism which is directly connected to the waveguide 53 and convects the liquid to compulsorily cool the waveguide 53. In this case, heat radiation and cooling efficiency of the laser array 52 adhered to the waveguide are significantly improved.

Furthermore, the laser light source employing a hollow waveguide in which a liquid is sealed is not restricted to that of the fourth embodiment. For example, the waveguide of the laser light source shown in FIG. 1, 6, 7, 8, or 9 may have a hollow structure in which a liquid is sealed.

Embodiment 5

Figure 12:
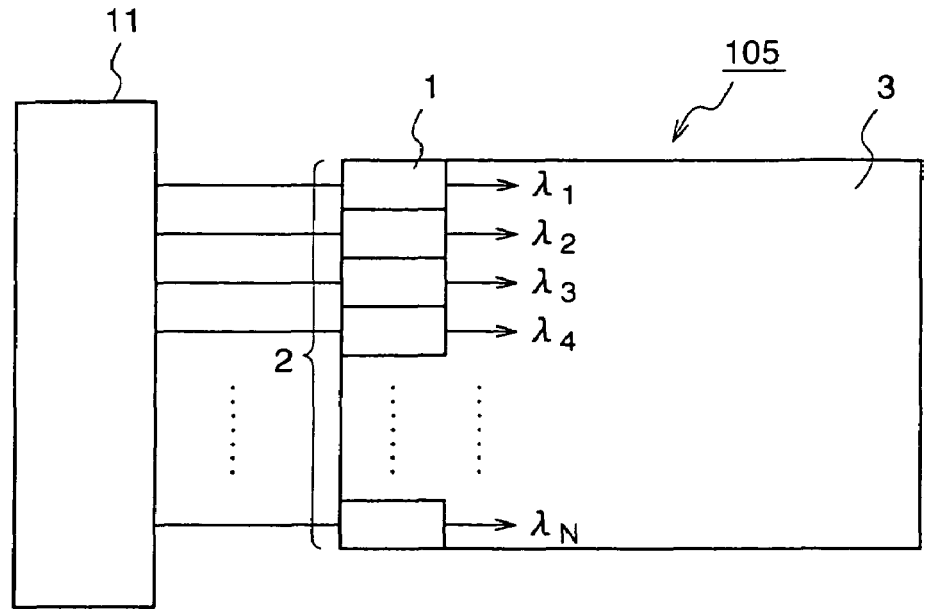
FIG. 12 is a diagram for explaining a laser light source according to a fifth embodiment of the present invention, illustrating the laser light source and a driving unit for driving the laser light source.

FIG. 12 is a diagram for explaining a laser light source according to a fifth embodiment of the present invention.

The laser light source 105 of the fifth embodiment is provided with a laser array 2 comprising plural semiconductor lasers 1, a transparent waveguide 3 comprising glass or the like in which laser beams emitted from the respective semiconductor lasers propagate, and a driving unit 11 for driving the respective semiconductor lasers 1 of the laser array.

The waveguide 3 and the laser array 2 are identical to those of the first embodiment.

The laser driving unit 11 applies driving currents of different magnitudes to the respective semiconductor lasers so that the laser beams outputted from the respective semiconductor lasers of the laser array 2 have different wavelengths.

Next, the function and effect will be described.

The laser light source 105 of the fifth embodiment constituted as described above can remove speckle noise that is peculiar to the laser light source while securing high output power and uniform cross-section light intensity, and hereinafter, this effect will be described more specifically.

The speckle noise is fine uneven noise that is caused by interference of scattering beams from the plural parts on the screen when the laser light is scattered on the screen in the case where image projection is carried out on the screen using a laser light source. In order to remove this speckle noise, there have been adopted a method of vibrating a screen, and a method of giving temporally and spatially random phases to the laser light by transmitting the laser light through a diffuser.

However, the method of vibrating the screen has a problem that the screen cannot be fixed, and the method using the diffuser has a problem that the quantity of light used for image projection is reduced.

According to the fifth embodiment, in the laser light source of the first embodiment, the oscillation wavelengths of the respective semiconductor lasers constituting the laser array are controlled to solve the above-mentioned problems, and hereinafter, the laser oscillation wavelength control will be described.

As described above, the speckle noise occurs when highly coherent laser light is used, and it is caused by interference of scattering beams on the screen. Accordingly, it is possible to reduce the speckle noise by temporally and spatially disordering the phases of the laser beams outputted from the light sources at random to average the speckle patterns observed by the laser beams from the respective light sources.

So, there is considered a method of reducing speckle noise by using plural laser beams of different wavelengths in a laser light source.

To be specific, when plural laser beams are projected on a screen, a speckle pattern to be finally observed on the screen is one obtained by overlapping the speckle patterns due to the respective laser beams. Further, when the laser beams have different wavelengths, different speckle patterns are obtained. Therefore, when plural laser beams having different wavelengths are used, a speckle pattern to be finally observed on the screen is one obtained by spatially averaging the plural speckle patterns. Further, when the respective speckle patterns are obtained independently (without correlation), averaging of the speckle patterns can be efficiently carried out.

The speckle noise discovered when the screen is observed is specifically caused by interference of laser beams reflected by irregularities at the surface of the screen.

A description will be given of, as a simple example, a speckle pattern caused by two laser beams of different oscillation wavelengths.

Figure 13:
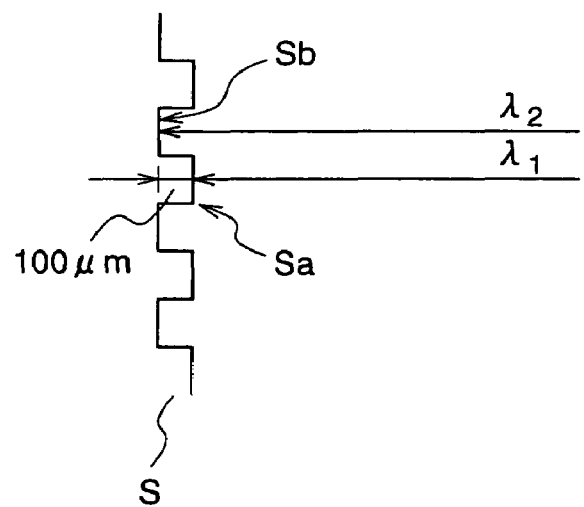
FIG. 13 is a diagram for explaining the operation of the laser light source according to the fifth embodiment.

As shown in FIG. 13, as for the two laser beams having different oscillation wavelengths, it is assumed that the phase of one laser beam (oscillation wavelength $\lambda 1$) that is reflected at a projection Sa of the screen and the phase of the other laser light (oscillation wavelength $\lambda 2$) that is reflected at a depression Sb of the screen has a phase difference of 1 wavelength or more. In this case, a speckle pattern due to these two laser beams, which appears on the screen, has less correlation with each other.

For example, it is considered that two laser beams having different wavelengths $\lambda 1$ and $\lambda 2$ ($\lambda 2 = \lambda 1 + \Delta\lambda$) are irradiated on a general screen with depressions and projections having step differences of 100 μm.

An optical path difference between the laser beam of wavelength $\lambda 1$ that is reflected at the highest portion of the screen surface (projection Sa) and the laser beam of wavelength $\lambda 2$ that is reflected at the deepest portion of the screen surface (depression Sb) is 200 μm. Accordingly, in this case, if a wavelength difference $\Delta\lambda$ of the two laser beams satisfies $(200/\lambda 2) \times \Delta\lambda \geq \lambda 1$, a phase difference of the two laser beams having different wavelengths which are reflected at the screen becomes equal to 1 wavelength or more of these laser beams.

Assuming that $\lambda 2 = 470$ nm (visible light of blue), since $\lambda 2 = \lambda 1 + \Delta\lambda$, $\Delta\lambda \approx 1.1 \times 10^{-3}$ μm = 1.1 nm. Accordingly, when the wavelength difference $\Delta\lambda$ between the two laser beams is 1 nm or more, correlations of speckle patterns observed due to the respective laser beams are reduced, and consequently, the speckle patterns are averaged.

Further, from the aspect of averaging of spatial speckle patterns, in order to perform averaging efficiently, it is desired that the oscillation wavelength differences between every adjacent semiconductor lasers should be approximately equal to each other among the plural semiconductor lasers constituting the laser array. In other words, assuming that the laser array comprises three semiconductor lasers, if the oscillation wavelengths of these semiconductor lasers differ within a range of Anm (A: real number), an oscillation wavelength difference between arbitrary two semiconductor lasers adjacent each other is desired to be (A/2)nm or lower.

Generally, when the laser array comprises N (N: integer not less than 3) semiconductor lasers, an oscillation wavelength difference between adjacent semiconductor lasers is desired to be about (A/(N−1))nm.

Further, since the correlation of speckle patterns becomes smaller as the difference in oscillation wavelengths between adjacent semiconductor lasers is larger, speckle noise can be reduced more effectively when (A/(N−1))>1 nm.

Further, it is desired that the output intensities of the respective semiconductor lasers should be approximately uniform. However, it is confirmed that the speckle noise reduction effect can be sufficiently achieved when a semiconductor laser having the highest output intensity is used as a reference and the remaining semiconductor lasers have output intensities not less than 50% of the highest output intensity.

Furthermore, the maximum oscillation wavelength difference A of the semiconductor lasers described above is preferably 30 nm or lower. The reason is as follows. When the laser light source is used as a light source of an image display unit, the maximum oscillation wavelength difference A of 30 nm or lower provides both the effect of reducing speckle noise and effect of increasing the color purities of red, blue, and green.

As described above, according to the fifth embodiment, the laser light source 105 is provided with the laser array 2 comprising plural semiconductor lasers, the waveguide 3 in which laser beams emitted from the respective semiconductor lasers propagate, and the driving unit 11 for driving the respective semiconductor lasers of the laser array, and different driving currents are applied to the respective semiconductor lasers so that the laser beams emitted from the respective semiconductor lasers of the laser array 2 have different wavelengths. Therefore, speckle patterns that appear on the screen can be spatially averaged by overlapping the different speckle patterns caused by the laser beams of different oscillation wavelengths, thereby reducing the speckle noise.

While in this fifth embodiment the plural semiconductor lasers of the laser light source according to the first embodiment are driven so as to have different oscillation wavelengths, the semiconductor lasers of the laser light source shown in any of FIGS. 6, 7, 8, 9, and 11 may be driven so as to have different oscillation wavelengths. Also in this case, the same effects as described for the fifth embodiment can be obtained.

Further, in this fifth embodiment, the laser light source has the laser array comprising the semiconductor lasers of approximately equal characteristics, and the driving unit applies driving currents of different magnitudes to the respective semiconductor lasers so that the semiconductor lasers have different oscillation wavelengths. However, the laser light source may have a laser array comprising plural semiconductor lasers that have different characteristics and output laser beams of different oscillation wavelengths, driving currents of the same level may be applied to the respective semiconductor lasers. Further, the laser light source may have a laser array comprising plural semiconductor lasers whose oscillation wavelengths can be controlled by a control current different from a driving current, such as DBR (Distributed Bragg Reflector) lasers, and the driving unit may apply the wavelength control current as well as the driving current to the respective semiconductor lasers.

Embodiment 6

Figure 14:
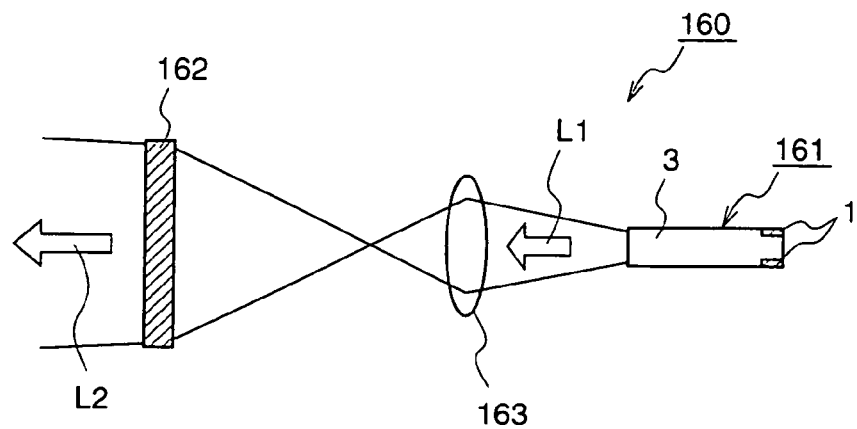
FIG. 14 is a diagram for explaining a lighting device according to a sixth embodiment of the present invention.

FIG. 14 is a diagram illustrating a light device according to a sixth embodiment of the present invention.

The light device 160 according to the sixth embodiment is provided with a laser light source 161 for emitting laser light, a liquid crystal pane 162 as a spatial light modulation device, and a condenser lens 163 for irradiating the liquid crystal panel 162 with the emission light L1 from the laser light source. Further, L2 denotes the laser light that has transmitted through the liquid crystal panel 162.

The laser light source 161 is identical to the laser light source 101a shown in FIG. 6.

In the laser light source 161, as described for the first embodiment, the cross-section light intensity distribution is made uniform while the laser beams emitted from the semiconductor lasers 1 propagate in the waveguide 3, and the laser light source outputs the emission light 4 whose cross-section light intensity distribution is unformized. Further, an image at the emission end face of the waveguide 3 (i.e., the emission light L1) is enlarged by the lens 163 when projected on the liquid crystal panel 162. At this time, for example, the shape of the cross-section of the waveguide 3 is made similar to the shape of the liquid crystal panel 162, whereby the emission light L1 can be effectively applied to the liquid crystal panel 162 without losing most of the quantity of the emission light L1. The emission light L1 applied to the liquid crystal panel 162 is modulated into laser light 103 that has arbitrary intensity distribution, i.e., that is displayed as a two-dimensional image, by giving a two-dimensional image signal to the liquid crystal panel 162.

Using the light device 160 according to the sixth embodiment realizes various sides of displays such as a rear projection type display and a head mount display. Further, it is also possible to project the laser beam L2 that has passed through the spatial light modulation device 162 onto the screen using an appropriate optical projection system.

While in the sixth embodiment the laser light source 161 is identical to the laser light source 101a according to the first embodiment shown in FIG. 6, the laser light source 161 may be identical to any of those shown in FIGS. 1, 7, 8, 9, and 11.

Embodiment 7

Figure 15:
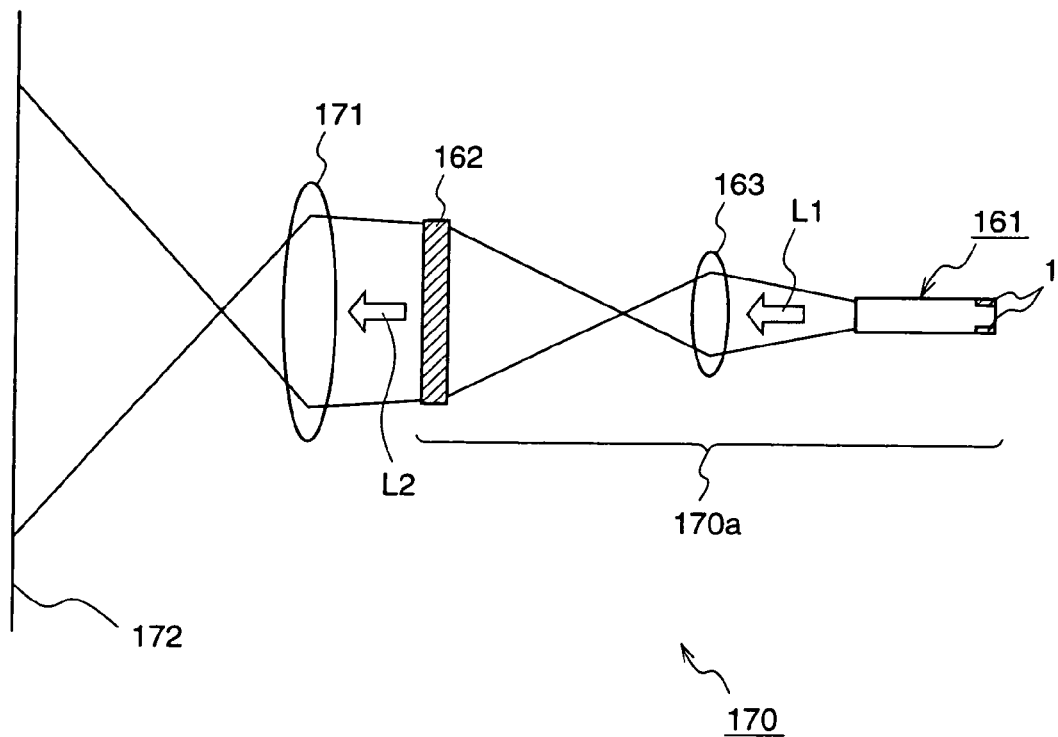
FIG. 15 is a diagram for explaining a two-dimensional image forming device according to a seventh embodiment of the present invention.

FIG. 15 is a diagram for explaining a two-dimensional image forming device according to a seventh embodiment of the present invention.

The two-dimensional image forming device 170 according to the seventh embodiment is provided with a lighting unit 170a constituting a lighting operation system, a projection lens 171 for enlarging and projecting modulated laser light outputted from the lighting unit 170a, and a screen 172 for displaying a two-dimensional image on receipt of the projection light from the projection lens 171. The lighting unit 170a has the same structure as the lighting unit 160 according to the sixth embodiment.

In the two-dimensional image forming device 170, as described above, the emission light L1 from the laser light source 161 is condensed by the condenser lens 163, and applied, with uniform light intensity distribution, to the liquid crystal panel 162 as a spatial light modulation device. The laser light applied to the liquid crystal panel is modulated into laser light L2 having arbitrary intensity distribution at the liquid crystal pane 162 and then enlarged and projected onto the screen 172 by the projection lens 171.

As described above, in the two-dimensional image forming device 170 according to the seventh embodiment, the laser light source is provided with the plural semiconductor lasers, and the waveguide in which the laser beams emitted from the respective semiconductor lasers propagate. Therefore, a compact and high-output laser light source having uniform cross-section light intensity can be easily obtained, thereby realizing an enlarged projection two-dimensional image forming device, such as a laser projector, which is compact and capable of projection in the 100 inch size class.

Further, the laser light source may be modified such that the respective semiconductor lasers constituting the laser array have different oscillation wavelengths, or the waveguide has a hollow cell structure in which a liquid is sealed, whereby speckle noise can be reduced, leading to space saving and cost reduction in the entire two-dimensional image forming device 170 due to reduction in the number of optical members.

While in this seventh embodiment the two-dimensional image forming device has a single laser light source, the two-dimensional image forming device may have laser light sources corresponding to red, blue, and green, respectively. In this case, for example, the laser light source corresponding to each color, i.e., red, blue, or green, is constituted such that the wavelength of semiconductor lasers 1 constituting the laser light source is set at the wavelength corresponding to the color, and the laser light source is provided with plural semiconductor lasers and a waveguide in which light beams emitted from the respective semiconductor lasers propagate, like the laser light source described for any of the first to fifth embodiments, thereby realizing a full-color two-dimensional image forming device that employs high-output laser light sources having uniform cross-section light intensities.

Further, the lighting unit described for the sixth or seventh embodiment is also applicable to such as a semiconductor exposure device that requires high output power and uniform lighting, by using semiconductor lasers in an ultraviolet wavelength band as components of the laser light source.

APPLICABILITY IN INDUSTRY

The present invention relates to high-output and laser light source having uniform intensity distribution, and it is applicable to high-output lighting, laser assist processing, or the like. Further, it is also applicable to an image display device such as a television receiver or a video projector, or an image forming device such as a semiconductor exposure device.

The invention claimed is:

1. A laser light source comprising:
   a plurality of semiconductor lasers for emitting a plurality of laser beams; and
   a hollow waveguide with a liquid sealed therein for propagating the plurality of laser beams; and
   a cooling mechanism connected to the waveguide for circulating the liquid sealed in the waveguide and cooling the plurality of semiconductor lasers,
   whereby the plurality of laser beams are emitted from one end face of the waveguide.

2. The laser light source as defined in claim 1 wherein a length L from the end face of the waveguide to a nearest light incident position satisfies a relational expression (1) as follows:

$$L \geq W/\tan(\sin^{-1}(\sin(\theta 3/2)/n))$$

wherein W is a width of the waveguide, n is a refractive index in the waveguide, and $\theta$ is a minimum beam spread angle of the semiconductor laser.

3. The laser light source as defined in claim 1 wherein
   said waveguide comprises a step difference portion at which the cross-section area of the waveguide varies in a light propagating direction, and
   said plurality of semiconductor lasers are disposed on the step difference portion.

4. The laser light source as defined in claim 3 wherein said waveguide comprises a plurality of step difference portions.

5. The laser light source as defined in claim 1 wherein the semiconductor lasers which are arranged in one line along the direction where the spread angles of light beams emitted from the semiconductor lasers are relatively small are shifted from the semiconductor lasers in the other line in a light emission direction.

6. The laser light source as defined in claim 5 wherein
said waveguide comprises step portions at which the cross-section area of the waveguide varies stepwise in a light propagating direction, and
said plurality of semiconductor lasers are disposed on the respective step portions.

7. The laser light source as defined in claim 1 wherein
said plurality of semiconductor lasers include at least two semiconductor lasers having different oscillation wavelengths, and
a maximum oscillation wavelength difference A (A: actual number) of the semiconductor lasers having different oscillation wavelengths satisfies $A \geqq 1$ nm.

8. The laser light source as defined in claim 7 wherein
said plurality of semiconductor lasers include at least three semiconductor lasers having different oscillation wavelengths, and
intervals of adjacent oscillation wavelengths are substantially constant.

9. The laser light source as defined in claim 7 wherein said maximum oscillation wavelength difference A satisfies $1 \text{ nm} \leqq A \leqq 30 \text{ nm}$.

10. The laser light source as defined in claim 1 wherein output light intensities of the semiconductor lasers are approximately uniform.

11. The laser light source as defined in claim 1 wherein said plurality of semiconductor lasers are multistripe lasers.

12. The laser light source as defined in claim 1 wherein said plurality of semiconductor lasers are multistack lasers.

13. A laser light source as defined in claim 1 wherein said plurality of semiconductor lasers are arranged to constitute at least one laser array.

14. The laser light source according to claim 1, wherein the plurality of semiconductor lasers are arranged in a direction where spread angles of the laser beams are relatively small.

15. A two-dimensional image forming device including a plurality of semiconductor lasers, a spatial light modulator for modulating light outputted from a laser light source, and a lighting optical system for illuminating the output light from the laser source to the spatial light modulator, wherein
said laser light source comprises:
a plurality of semiconductor lasers for emitting a plurality of laser beams; and
a hollow waveguide with a liquid sealed therein for propagating the plurality of laser beams; and
a cooling mechanism connected to the waveguide for circulating the liquid sealed in the waveguide and cooling the plurality of semiconductor lasers,
whereby the plurality of laser beams is emitted from one end face of the waveguide.

16. The two-dimensional image forming device as defined in claim 15 further including a projection optical system for projecting output light from the spatial light modulator.

* * * * *